United States Patent [19]

Leipold et al.

[11] Patent Number: 5,371,418
[45] Date of Patent: Dec. 6, 1994

[54] DRIVE CIRCUIT FOR A POWER MOSFET WITH LOAD AT THE SOURCE SIDE

[75] Inventors: Ludwig Leipold; Rainald Sander; Jenoe Tihanyi, all of Munich, Germany

[73] Assignee: Siemens Aktiengesellschaft, Munich, Germany

[21] Appl. No.: 95,197

[22] Filed: Jul. 23, 1993

[30] Foreign Application Priority Data

Aug. 4, 1992 [DE] Germany .................. 4225754

[51] Int. Cl.$^5$ .......................... H03K 17/687
[52] U.S. Cl. ......................... 327/109; 327/108; 327/427
[58] Field of Search ............. 302/270, 296.2, 296.1, 302/573, 607, 571; 363/60; 323/313

[56] References Cited

U.S. PATENT DOCUMENTS

| | | | |
|---|---|---|---|
| 4,559,548 | 12/1985 | Iizuka et al. | 307/296.2 |
| 4,603,269 | 7/1986 | Hochstein | 307/571 |
| 4,721,986 | 1/1988 | Kinzer | 307/571 |
| 4,725,813 | 2/1988 | Miyada | 302/571 |
| 4,733,108 | 3/1988 | Truong | 307/296.2 |
| 4,736,121 | 4/1988 | Cini et al. | 307/270 |
| 4,737,667 | 4/1988 | Tihanyi | 307/482 |
| 4,796,174 | 1/1989 | Nadd | 363/60 |
| 4,920,280 | 4/1990 | Cho et al. | 307/296.2 |
| 5,272,399 | 12/1993 | Tihanyi et al. | 302/270 |

FOREIGN PATENT DOCUMENTS

0240436A1 10/1987 European Pat. Off. .

OTHER PUBLICATIONS

IEEE Transactions on Electron Devices, vol. 37, No. 4, Apr., 1990, "The Smart Power High-Side Switch: Description Of A Specific Technology, Its Basic Devices, And Monitoring Circuitries" by Elmoznine et al., pp. 1154-1161.

Patent Abstracts of Japan, Publication No. JP59097223, published May 6, 1984, Ooguro Takeshi et al, "Load Driving Circuit".

Siemens Forsch.-u. Entwickl.-Ber., vol. 17, 1988, No. 1, "Smart SIPMOS Technology" by J. Tihanyi, pp. 35-42.

Primary Examiner—Timothy P. Callahan
Assistant Examiner—Dinh T. Le
Attorney, Agent, or Firm—Hill, Steadman & Simpson

[57] ABSTRACT

Power FETs having a load at the source side require a gate voltage lying above the drain voltage in order to be driven completely conductive. This can occur with a known pump circuit. In the drive circuit disclosed, the diode connected to the gate terminal of the power FET is a depletion FET whose substrate terminal is applied to the oscillating voltage that is required for the operation of the pump circuit. The cut off voltage is thus synchronously set relative to the oscillating voltage such that low losses arise when loading $C_{GS}$ and an adequately high inhibit voltage can be built up when loading the pump capacitor.

6 Claims, 1 Drawing Sheet

DRIVE CIRCUIT FOR A POWER MOSFET WITH LOAD AT THE SOURCE SIDE

BACKGROUND OF THE INVENTION

The invention is directed to a drive circuit for a power MOSFET with a load at the source side having first and second diodes connected following one another, at whose junction a first terminal of the capacitor is connected. An oscillating voltage is applied to the second terminal of this capacitor. The second diode is connected to a gate terminal of the power MOSFET. The first diode connects to a voltage source.

Such a drive circuit, for example, has been disclosed by European Patent 0 236 967, corresponding to U.S. Pat. No. 4,737,667. In an integrated arrangement of this type, the diodes cannot be manufactured in a self-insulating technique because of parasitic transistor effects when inhibiting or blocking voltages higher than 0.5...0.7 V must be provided. The conducting voltage of 0.5...0.7 V inherent in the diodes, moreover, leads to losses that can no longer be left out of consideration when the operating voltage amounts, for example, to only 5 V.

SUMMARY OF THE INVENTION

An object of the invention is to improve a drive circuit of the type set forth such that it can be manufactured in a self-insulating technique and the losses can be reduced in the pump mode of operation.

This object is achieved in that the second diode is a depletion FET connected as a diode, and wherein the depletion FET has a substrate terminal that is connected to the second terminal of the capacitor.

The invention shall be set forth in greater detail with reference to the drawings.

DESCRIPTION OF THE PREFERRED EMBODIMENTS

Figure 1:
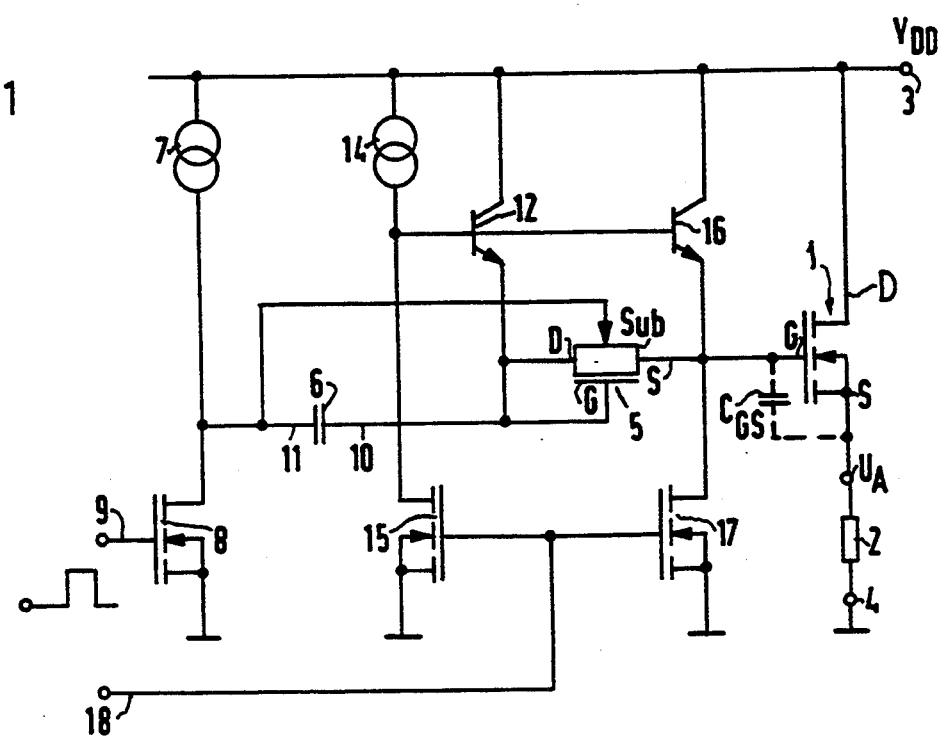
FIG. 1 is a circuit structure of the invention.

The drive circuit of FIG. 1 contains a power FET 1 to which a load 2 at the source side is connected in series. The series circuit lies at an operating voltage $V_{DD}$ via two terminals 3, 4. The drain terminal D of the power FET is thereby connected to the terminal 3. The source terminal S of a depletion FET 5 connected as a diode is connected to the gate terminal G of FET 1. The depletion FET 5 is of the same conductivity type as the power FET 1. The drain terminal D of the depletion FET 5 is connected to a first terminal 10 of a capacitor 6; its second terminal 11 can be applied to ground via a first controllable switch 8. The second terminal 11 of the capacitor 6 is applied to $V_{DD}$ via a first current source 7. Further, the drain terminal of the depletion FET 5 is connected to $V_{DD}$ via the emitter-collector path of a first bipolar transistor 12. Its base terminal is connected to the node of a series circuit that is composed of a second current source 14 and a second controllable switch 15. The current source 14 is thereby connected between the base terminal of the bipolar transistor 12 and the terminal 3. Further, the series circuit of a second bipolar transistor 16 and a third controllable switch 17 is connected between the terminal 3 and ground. The node of this series circuit is connected to the gate terminal G of the power FET 1. The second and third controllable switch 15 or 17 are executed here as field effect transistors whose gate terminals are connected to an input terminal 18.

Let it be assumed for explaining the operation that the power FET 1 is initially inhibited; the controllable switches 15 and 17 are in the conductive condition due to a positive voltage at the input terminal 18. When they are inhibited, then the bipolar transistors 16 receive control current via the current source 14 and become transmissive. The gate-source capacitance $C_{GS}$ of the power FET 1 can thus be charged and it begins to conduct. The output voltage $U_A$ at the source terminal of the power FET I thus rises and its gate voltage must be increased farther in order to drive the power FET 1 fully conductive.

A voltage that, for example, can oscillate between 0 and 5 V is now applied to the input 9 of the controllable switch 8. Given a conductive switch 8, a current flows through the first bipolar transistor 12 and charges a capacitor 6. Ground potential always lies at its second terminal 11 when the controllable switch 8 is driven conductive. When it is inhibited, it is essentially the potential $V_{DD}$ that is present at the second terminal 11 via the current source 7. When the voltage at the capacitor 6 is high enough, then a current flows through the depletion FET 5 into the gate-source capacitance $C_{GS}$ of the power FET 1. Since the potential at the second terminal 11 of the capacitor essentially oscillates between 0 and $V_{DD}$, the voltage at the first terminal 10 of the capacitor 6 essentially oscillates between $V_{DD}$ and 2 $V_{DD}$. A discharge of the capacitor 6 is prevented by the base-emitter path of the bipolar transistor 12 that forms the afore-mentioned first diode.

The depletion FET 5 comprises a substrate control such that its substrate terminal Sub is connected to the second terminal 11 of the capacitor 6. For example, the voltage at the substrate terminal likewise oscillates between the value 0 and $V_{DD}$. A change in the cut off voltage of the depletion FET 5 corresponding to the frequency at the input is achieved with this substrate control. When the substrate lies at the potential of 0 V, then the IDS/UDS characteristic is displaced in the direction toward higher ID values and the cut off voltage of the depletion FET 5 lies at a first, higher value. When the substrate lies at the potential $V_{DD}$, then the IDS/UDS characteristic is displaced in the direction toward lower 19 values and the cut off voltage lies at a lower value. This in turn means that a great deal of current can already flow given a slight drain-source voltage with a substrate bias $V_{DD}$. This is equivalent to a steep amplitude characteristic of the diode formed by the depletion FET 5. When, by contrast, the substrate lies at 0 V, then the diode inhibits and the; source voltage becomes higher than the drain voltage.

Figure 2:
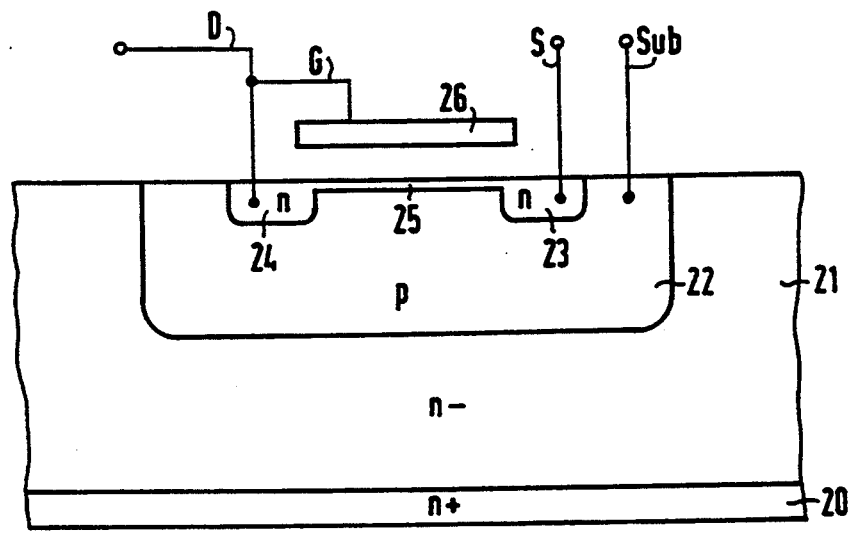
FIG. 2 is a section through the depletion FET in self-insulating technique with a substrate terminal.

How the depletion FET 5 is constructed in self-insulating technique is shown in FIG. 2. It is integrated on a highly n-conductive semiconductor layer 20 which is adjoined by a more lightly n-doped, thick layer 21. A p-doped well 22 is embedded into the layer 21, an n-conductive source zone 23 and an n-conductive drain zone 24 being in turn embedded thereinto. Source zone 23 and drain zone 24 are connected to one another by an n-conductive channel 25. The depletion FET is controlled by a gate electrode 26 that is essentially arranged above the channel 25. The drain terminal D is connected to the gate terminal G. The source zone 23 has a source terminal S. The p-doped well 22 has the substrate terminal Sub. As a result of the voltage applied to the well 22 via the substrate terminal, the cut off voltage of the depletion FET can be set independently of the gate voltage.

With slight modification, the invention can also be utilized for that case wherein the second terminal 11 of the capacitor is directly connected to the output of an oscillating voltage source. The current source 7 and the controllable switch 8 would thereby be omitted.

Although various minor changes and modifications might be suggested by those skilled in the art, it will be understood that we wish to include within the scope of the patent warranted hereon, all such changes and modifications as reasonably come within our contribution to the art.

We claim:

1. A drive circuit for a power MOSFET with a load connected at a source side of the MOSFET, comprising:
   the pump circuit comprising a depletion FET having a gate terminal, a drain terminal, a source terminal, and a substrate terminal, and wherein its gate terminal is connected to its drain terminal and its source terminal is connected to drive said power MOSFET;
   a capacitor having a first terminal thereof connected to the drain terminal of said depletion FET and a second terminal connecting to an oscillating voltage and also to said substrate terminal of said depletion FET; and
   a diode connecting said depletion FET drain terminal to a power source.

2. A drive circuit according to claim 1 wherein said second terminal of said capacitor is connected to a node of a first series circuit formed of a first current source and a first controllable switch, and said first current source being connected to a drain terminal of said power MOSFET, said first controllable switch being connected to ground, the first controllable switch having an input, and said oscillating voltage being applied to said input.

3. A drive circuit according to claim 2 wherein said diode connected to said drain of said depletion FET is a base-emitter path of a first bipolar transistor;
   a base terminal of said first bipolar transistor being connected to a node of a second series circuit formed of a second current source and a second controllable switch; and
   said second current source being connected to said drain terminal of said power MOSFET and said second controllable switch being connected to ground.

4. A drive circuit according to claim 3 wherein a series circuit of a second bipolar transistor and a third controllable switch has a junction node therebetween connected to said gate terminal of said power MOSFET, and base terminals of said first and second bipolar transistors being connected together.

5. A drive circuit according to claim 4 wherein:
   the second and third controllable switches comprise MOSFETs; and
   the gate terminals of the second and third controllable MOSFETs being connected to one another and connected to a control voltage.

6. A drive circuit and power MOSFET assembly, comprising:
   a depletion FET having a gate terminal, a drain terminal, a source terminal, and a substrate terminal, and wherein its gate and drain terminals are connected together so that the depletion FET is connected as a diode, and wherein its source terminal connects to a gate of said power MOSFET;
   a bipolar transistor connected between the drain of the depletion FET and a drain of said power MOSFET;
   a capacitor connected between said drain of said depletion FET and an oscillating voltage; and
   said substrate terminal of said depletion FET connecting to said oscillating voltage.

* * * * *